United States Patent
Solignac et al.

(10) Patent No.: US 11,255,926 B2
(45) Date of Patent: Feb. 22, 2022

(54) SYSTEM AND METHOD FOR SUPPRESSING LOW FREQUENCY NOISE OF MAGNETORESISTIVE SENSORS

(71) Applicant: COMMISSARIAT À L'ÉNERGIE ATOMIQUE ET AUX ÉNERGIES ALTERNATIVES, Paris (FR)

(72) Inventors: Aurélie Solignac, Massy (FR); Claude Fermon, Orsay (FR); Myriam Pannetier-Lecoeur, Bures sur Yvette (FR); Vincent Trauchessec, Paris (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 70 days.

(21) Appl. No.: 16/618,655

(22) PCT Filed: Jun. 1, 2018

(86) PCT No.: PCT/EP2018/064502
§ 371 (c)(1),
(2) Date: Dec. 2, 2019

(87) PCT Pub. No.: WO2018/220193
PCT Pub. Date: Dec. 6, 2018

(65) Prior Publication Data
US 2021/0141033 A1     May 13, 2021

(30) Foreign Application Priority Data
Jun. 2, 2017 (FR) .................................. 1754901

(51) Int. Cl.
*G01R 33/09* (2006.01)
*G01R 33/00* (2006.01)

(52) U.S. Cl.
CPC ......... *G01R 33/0029* (2013.01); *G01R 33/09* (2013.01)

(58) Field of Classification Search
CPC ............ G01R 33/0029; G01R 33/0041; G01R 33/093; G01R 33/09
See application file for complete search history.

(56) References Cited

U.S. PATENT DOCUMENTS

| 2008/0224695 A1* | 9/2008 | Leroy .................... G01R 33/09 324/252 |
| 2017/0168123 A1* | 6/2017 | Kandori ............... G01R 33/022 |
| 2020/0182947 A1* | 6/2020 | Pannetier-Lecoeur ...................... G01R 33/0029 |

FOREIGN PATENT DOCUMENTS

| EP | 2 165 206 A1 | 3/2010 |
| EP | 2 165 210 A2 | 3/2010 |

(Continued)

OTHER PUBLICATIONS

International Search Report as issued in International Patent Application No. PCT/EP2018/064502, dated Jul. 5, 2018.

*Primary Examiner* — Alesa Allgood
(74) *Attorney, Agent, or Firm* — Pillsbury Winthrop Shaw Pittman LLP

(57) ABSTRACT

A system for suppressing low frequency noise of magnetoresistive sensors, includes a device for measuring a magnetic field, the device including at least one magnetoresistive sensor, the magnetoresistive sensor having a first sensitivity at a first operating point and a second sensitivity at a second operating point, the sensitivity at the second operating point being low or zero; a modulator configured to switch the at least one magnetoresistive sensor from the first operating point to the second operating point; and a signal processor for processing the signal derived from the device for measuring a magnetic field.

10 Claims, 13 Drawing Sheets

(56) References Cited

FOREIGN PATENT DOCUMENTS

WO     WO 2009/001160 A1    12/2008
WO     WO 2009/001162 A2    12/2008
WO     WO-2009001160 A1 * 12/2008  ............. B82Y 25/00

* cited by examiner

| 708 Ta | 707 NiFe | 706 CoFe10 | 705 MgO | 704 CoFeB | 703 PtMn | 702 Ta | 701 CuN |

Figure 8

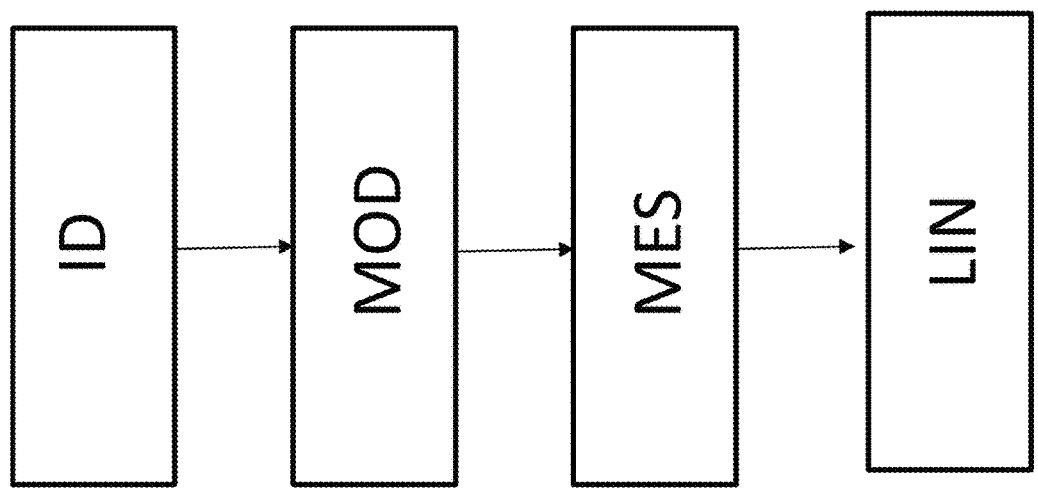

SYSTEM AND METHOD FOR SUPPRESSING LOW FREQUENCY NOISE OF MAGNETORESISTIVE SENSORS

CROSS-REFERENCE TO RELATED APPLICATIONS

This application is the U.S. National Stage of PCT/EP2018/064502, filed Jun. 1, 2018, which in turn claims priority to French patent application number 1754901 filed Jun. 2, 2017. The content of these applications are incorporated herein by reference in their entireties.

FIELD OF THE INVENTION

The present invention relates to a system and a method for suppressing low frequency noise of a magnetoresistive type sensor. Magnetoresistive sensors cover giant magnetoresistance (GMR) sensors and tunnel magnetoresistance (TMR) sensors, but the method may be extended to any magnetic field sensor of magnetoresistive type.

PRIOR ART

The low frequency noise of magnetoresistive sensors such as GMRs or TMRs is today considered as the major obstacle to their use in certain applications requiring very high detectivity in low frequencies. An example of these applications is the measurement of magnetic fields in biological media, such as the magnetic fields associated with physiological signals and in particular neural signals. These signals vary slowly, with frequencies less than 1 KHz and their detection is affected by the low frequency noise of the sensor used during the measurement.

For anisotropic magnetoresistance (AMR) type sensors, a change of current direction method makes it possible to suppress a part of their 1/f noise (see for example I. Mateos et al. "Low-frequency noise characterization of a magnetic field monitoring system using an anisotropic magnetoresistance", published in Sensors and Actuators A, Volume 235, 2015). This technique cannot be applied to GMRs and TMRs because their resistance and their change in resistance do not depend on the direction of current.

Techniques for modulating the field seen by the sensor may be applied. These techniques displace the operating point of the sensor outside of its low frequency noise. Examples of such techniques are described in the articles "Towards picoTesla Magnetic Field Detection Using a GMR-MEMS Hybrid Device" of A. Guedes et al., published in IEEE TRANSACTIONS ON MAGNETICS, Vol. 48, N. 11, Pages 4115-4118, 2012, and "Minimizing 1/f noise in magnetic sensor using a microelectromechanical system flux concentrator", of A. S. Edelstein et al., published in the Journal of Applied Physics, Vol. 91, page 7795, 2002.

These publications propose using frequency modulated flux concentrators but this technique gives modest results and requires the use of MEMS (micro electro mechanical systems) to carry out a mechanical modulation.

In the particular case of sensors coupled to superconducting current loops, a modulation of the supercurrent can relatively efficiently suppress low frequency noise by also displacing the operating point of the sensor to higher frequency. Such solutions are described in the patent documents EP2165206 and EP2165210.

However, these techniques have several drawbacks such as difficulties of implementation, a limitation to miniaturisation, low efficiency or instead the use of superconducting materials which require specific conditions of use and may be expensive.

SUMMARY OF THE INVENTION

The invention aims to resolve the aforementioned problems by proposing a system for suppressing low frequency noise of magnetoresistive sensors, this system being reliable, of low bulk and which can be produced from any type of magnetoresistive sensor.

To this end, a first subject matter of the invention is a system for suppressing low frequency noise of magnetoresistive sensors, said suppression system including:

A device for measuring a magnetic field, said device including at least one magnetoresistive sensor, said magnetoresistive sensor having a first sensitivity at a first operating point and a second sensitivity at a second operating point, the sensitivity at the second operating point being low or zero;

Modulation means suited to switching the magnetoresistive sensor from the first operating point to the second operating point and from the second operating point to the first operating point, said modulation means having a first configuration corresponding to the first operating point and a second configuration corresponding to the second operating point;

Means for processing the signal derived from the device for measuring a magnetic field, said processing means being suited to making a linear combination of a first response of the measuring device in the presence of the magnetic field at the first operating point corresponding to the first configuration of the modulation means and a second response of the measuring device in the presence of the magnetic field at the second operating point corresponding to the second configuration of the modulation means.

Magnetoresistive sensor C is taken to signify any element having an electrical resistance dependent on the external magnetic field. By measuring the variation in resistance at the terminals of the element C, it is possible to measure the external magnetic field. External magnetic field or magnetic field is taken to signify the magnetic field that it is wished to measure.

Tunnel magnetoresistance TMR sensors and giant magnetoresistance GMR sensors may be used within the scope of the present invention.

According to an embodiment of the invention, the GMR or TMR magnetoresistive sensors used are hysteresis-free sensors.

Each magnetoresistive sensor used within the scope of the present invention has different operating points having different sensitivity.

Modulation means M are taken to signify means making it possible to modify periodically the sensitivity of the magnetoresistive sensors used. The means M may include a current or voltage generator. The modulation carried out by the means M is for example a periodic variation in the sensitivity of the magnetoresistive sensors C.

The frequency of this modulation is greater than the frequency of the low frequency noise that it is wished to eliminate.

Low or zero sensitivity of the magnetoresistive sensor C is taken to signify a sensitivity below 0.05%/mT in the case of a GMR having a typical sensitivity of 1%/mT and 1%/mT for a TMR having a sensitivity of 20%/mT Means for processing the signal T are taken to signify means used to select the response M1 of the device D when the device D is at the first operating point and the response M2 of the device D when the device is at the second operating point. The means for processing the signal T are also suited to making a linear combination of the responses M1 and M2. The processing means T may include analogue circuits, digital circuits or a mixture of analogue and digital circuits.

The low frequency noise associated with a magnetoresistive sensor C is, as in all conductors, a fluctuation in resistance noise. Furthermore, the external field also creates for its part a change in resistance. In the case of use of a magnetoresistive sensor to measure a slowly variable magnetic field, the two variations in resistance thus cannot be separated by a single measurement.

The proposed invention is based on a principle different to those proposed until now. It consists in making the magnetoresistive sensor oscillate between two different operating points. The two points are chosen in such a way that the response to an external magnetic field is different. The response of the sensor to the external magnetic field is also called sensitivity of the sensor. The oscillation of the sensor between two different operating points is also called modulation of the sensitivity of the sensor.

In other words, the invention consists in making the sensor oscillate between these two measurement points at a more rapid frequency than the 1/f noise domain as indicated in FIG. 1 and thus measuring at high frequency the response of the sensor in each state. Two independent curves, M1 and M2, are thereby obtained, the two curves being time dependent. A linear combination of these two curves makes it possible to obtain a curve uniquely dependent on the external field and a curve giving internal fluctuations in resistance.

The reconstitution of these two curves, M1 and M2, may be done either digitally, or analogically.

The invention will be all the more efficient when the two points correspond to very different sensitivities.

In particular, the fact of having chosen a second operating point having low or zero sensitivity makes it possible to only retain, in the measurement M2 corresponding to this operating point, the variations in resistance due mainly to low frequency noise, the sensor no longer being sensitive to the external field B. This measurement may next be subtracted from the measurement M1 made at the first operating point, so as to isolate fluctuations in resistance essentially due to the variation in the external magnetic field B and thus corresponding to a measurement of this external field.

The device according to the invention thus makes it possible to separate the variations in resistance of a magnetoresistive sensor due to low frequency noise and the variations in resistance due to the variation in the external magnetic field B. In other words, the device according to the invention makes it possible to suppress the low frequency noise of magnetoresistive sensors.

The device according to the invention may also have one or more of the characteristics below, considered individually or according to all technically possible combinations thereof:

the device D for measuring a magnetic field B includes two magnetoresistive sensors 301, 302 arranged according to a half-bridge arrangement and a low noise preamplifier PA, the two magnetoresistive sensors having an inverse response to the magnetic field, the half-bridge arrangement including a first arm B1 and a second arm B2, the two arms being connected in parallel, each of the arms including a resistor R and one of the magnetoresistive sensors 301, 302, the half-bridge arrangement further including a first V+ and a second V− output, the two outputs being connected to the low noise preamplifier PA, each output V+, V− being the junction point between one of the resistors R and one of the magnetoresistive sensors 301, 302;

the measuring system D includes a DC voltage source V for the supply of the half-bridge arrangement, the DC voltage V being connected to the junction point between the two resistors R or to the junction point between the two magnetoresistive sensors 301, 302;

the measuring device D includes a first 401, 401*a* and a second 402, 402*a* pair of magnetoresistive sensors and a low noise preamplifier PA, the sensors of the first pair 401, 401*a* having an inverse response compared to the sensors of the second pair 402, 402*a*, the magnetoresistive sensors 401, 401*a*, 402, 402*a* being arranged according to a bridge arrangement, the bridge arrangement including a first arm B1 and a second arm B2, the two arms being connected in parallel, each of the arms including a magnetoresistive sensor of the first pair 401, 401*a* and a magnetoresistive sensor of the second pair 402, 402*a*, the bridge arrangement further including a first V+ and a second V− output, the two outputs being connected to the low noise preamplifier, each output V+, V− being the junction point between a magnetoresistive sensor of the first pair 401, 401*a* and a magnetoresistive sensor of the second pair 402, 402*a*;

the measuring system D includes a DC voltage source V for the supply of the bridge arrangement, the DC voltage source V being connected to a junction point between a magnetoresistive sensor of the first pair and a magnetoresistive sensor of the second pair;

the measuring device D includes local heating means so as to flip the reference layer 703, 704 of at least one of the magnetoresistive sensors;

the measuring device D includes current lines 301, 302, 403, 404 to apply a magnetic field in the plane of the layers of the magnetoresistive sensors, such that in the presence of current in the lines each magnetoresistive sensor C is at the second operating point 202 and in the absence of current in the lines each magnetoresistive sensor C is at the first operating point 201;

when the current is applied, the magnetoresistive sensors having inverse responses are at the second operating point (202) having low or zero sensitivity (Ssat), while having the same resistance;

the modulation means M include a high frequency master clock for the generation of a signal L1/L2 for switching between the first operating point 201 and the second operating point 202;

the switching signal L1/L2 includes current pulses circulating in the current lines 301, 302, 403, 404 for the switching of each magnetoresistive sensor between the first operating point 201 and the second operating point 202;

the means T for processing the signal derived from the device D for measuring a magnetic field B include a device for rapid digital acquisition of the signal derived from the preamplifier PA;

the means T for processing the signal derived from the device D for measuring a magnetic field B include:

A first Sample and Hold circuit intended to record the signal M1 measured by the measuring device D at the first operating point 201;

A second Sample and Hold circuit intended to record the signal M2 measured by the measuring device D at the second operating point 202;

A digital DSP or analogue 1301 acquisition system for the linear combination of the signals derived from the first and second Sample and Hold circuits;

the master clock further generates a first control signal SH1 of the first Sample and Hold circuit and a second control signal SH2 of the second Sample and Hold circuit.

Another subject matter of the invention is a method for suppressing low frequency noise associated with the measurement of a magnetic field by a measuring device including at least one magnetoresistive sensor, said method including the following steps:

Identifying a first and a second operating point of the at least one magnetoresistive sensor, the magnetoresistive sensor having a first sensitivity at the first operating point and a second sensitivity at the second operating point, the sensitivity at the second operating point being low or zero;

Modulating the sensitivity of the magnetoresistive sensor by switching the magnetoresistive sensor from the first operating point having the first sensitivity to the second operating point having the second sensitivity and from the second operating point to the first operating point;

During the modulation, measuring a first response of the measuring device D in the presence of the magnetic field at the first operating point S1 and a second response M2 of the measuring device in the presence of the magnetic field at the second operating point;

Calculating a linear combination of the first response M1 and the second response M2 of the measuring system D.

The first step of the method according to the invention makes it possible to identify the two operating points of the magnetoresistive sensors comprised in the device D, the two operating points having two different sensitivities.

Advantageously, the second operating point is chosen so as to have low or zero sensitivity to the external magnetic field. This makes it possible to differentiate fluctuations in resistance due to low frequency noise of the sensor C from fluctuations in resistance due to the external magnetic field.

The sensitivity of the sensor is next modulated, for example using modulation means M, so as to switch the magnetoresistive sensors of the device D between the two operating points.

It is thus possible to measure the response of the device D at the first and at the second operating points, so as to identify fluctuations in resistance mainly due to low frequency noise in condition of low or zero sensitivity of the magnetoresistive elements.

The method according to the invention may also have one or more of the characteristics below, considered individually or according to all technically possible combinations thereof:

the frequency of modulation of the sensitivity of the sensor is greater than the frequency 101 at which the low frequency noise becomes less than the thermal noise associated with the sensor C;

the frequency of modulation MOD of the sensitivity of the sensor is at least two times greater than the frequency 101 at which the low frequency noise becomes less than the thermal noise associated with the sensor C;

the measuring device D includes two magnetoresistive sensors 301, 302 arranged according to a half-bridge arrangement and a preamplifier, the two magnetoresistive sensors having an inverse response to the magnetic field, the half-bridge arrangement including a first arm B1 and a second arm B2, the two arms being connected in parallel, each of the arms including a resistor R and one of the magnetoresistive sensors 301, 302, the half-bridge arrangement further including a first V+ and a second V− output, the two outputs being connected to the low noise preamplifier, each output V+, V− being the junction point between one of the resistors R and one of the magnetoresistive sensors 301, 302;

the measuring device D includes a first 401, 401a and a second 402, 402a pair of magnetoresistive sensors and a low noise preamplifier, the sensors of the first pair 401, 401a having an inverse response compared to the sensors of the second pair 402, 402a, the magnetoresistive sensors 401, 401a, 402, 402a being arranged according to a bridge arrangement, the bridge arrangement including a first arm B1 and a second arm B2, the two arms being connected in parallel, each of the arms including a magnetoresistive sensor of the first pair 401, 401a and a magnetoresistive sensor of the second pair 402, 402a, the bridge arrangement further including a first V+ and a second V− output, the two outputs being connected to the low noise preamplifier, each output V+, V− being the junction point between a magnetoresistive sensor of the first pair 401, 401a and a magnetoresistive sensor of the second pair 402, 402a;

the step MOD of modulation of the sensitivity of at least one magnetoresistive sensor is carried out using a current line arranged in the vicinity of the at least one magnetoresistive sensor and suited to generating a magnetic field in the plane of the layers of the magnetoresistive sensor, so as to saturate the magnetoresistive sensor by reducing or cancelling its sensitivity when the sensor is at the second operating point;

the step of measuring MES the first response M1 of the measuring device D and the second response M2 of the measuring device D is carried out using a digital or analogue acquisition system 1101;

the step of linear combination LIN is carried out using a digital or analogue acquisition system.

LIST OF FIGURES

Other characteristics and advantages of the invention will become clear from the description that is given thereof below, for indicative purposes and in no way limiting, with reference to the appended figures, among which:

FIG. 8 shows a typical stack of a magnetoresistance tunnel TMR sensor; such a sensor may be used in the device D illustrated in FIG. 1;

Figure 9:
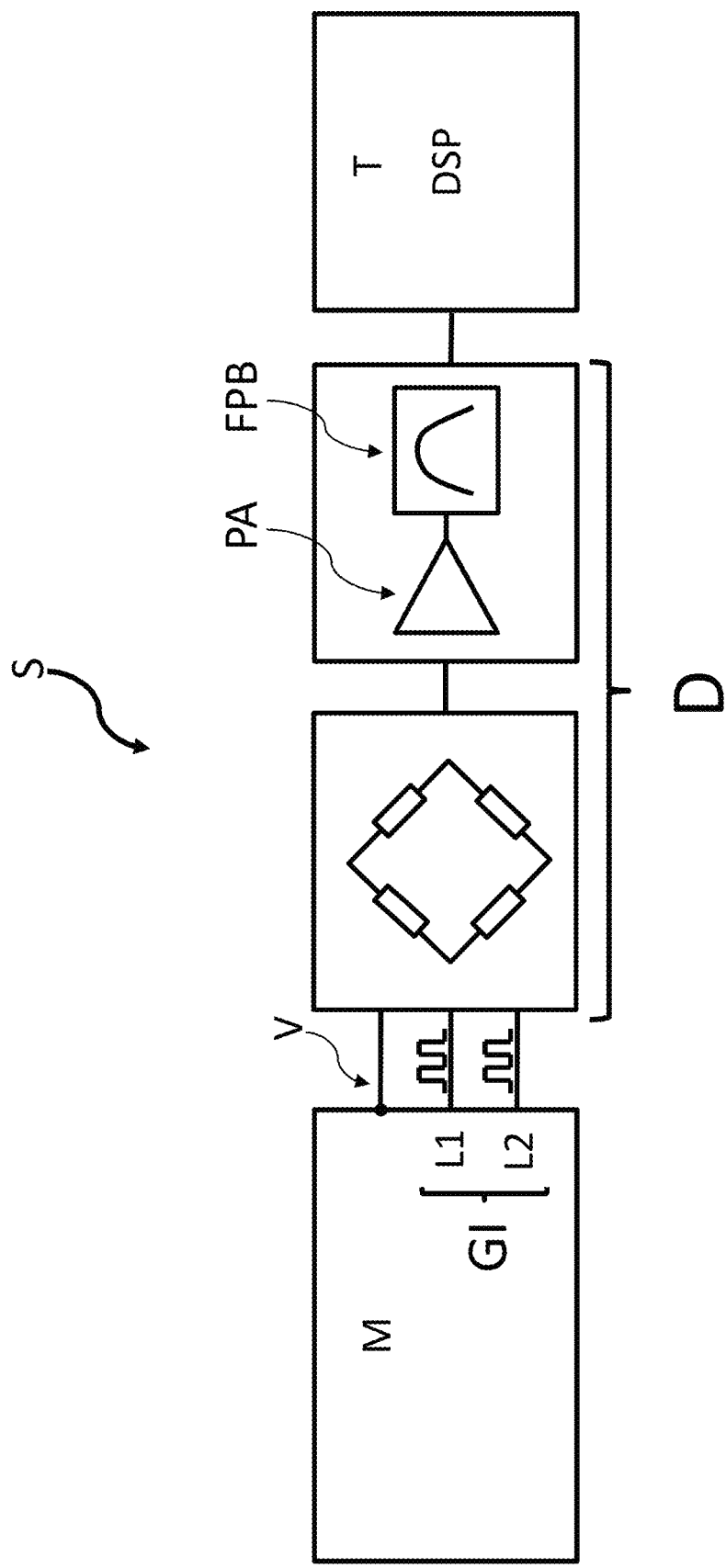
Figure 10:
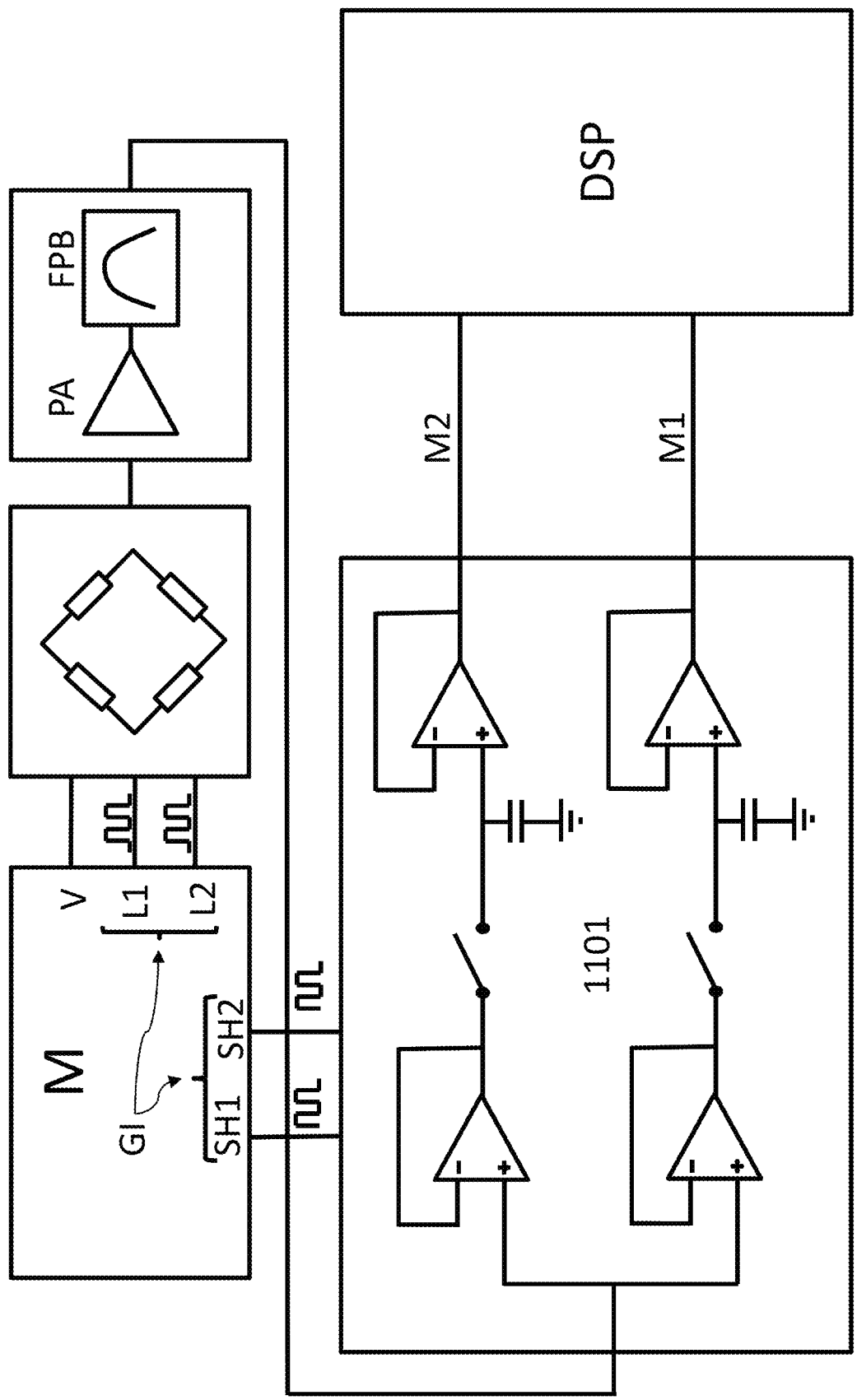
Figure 11:
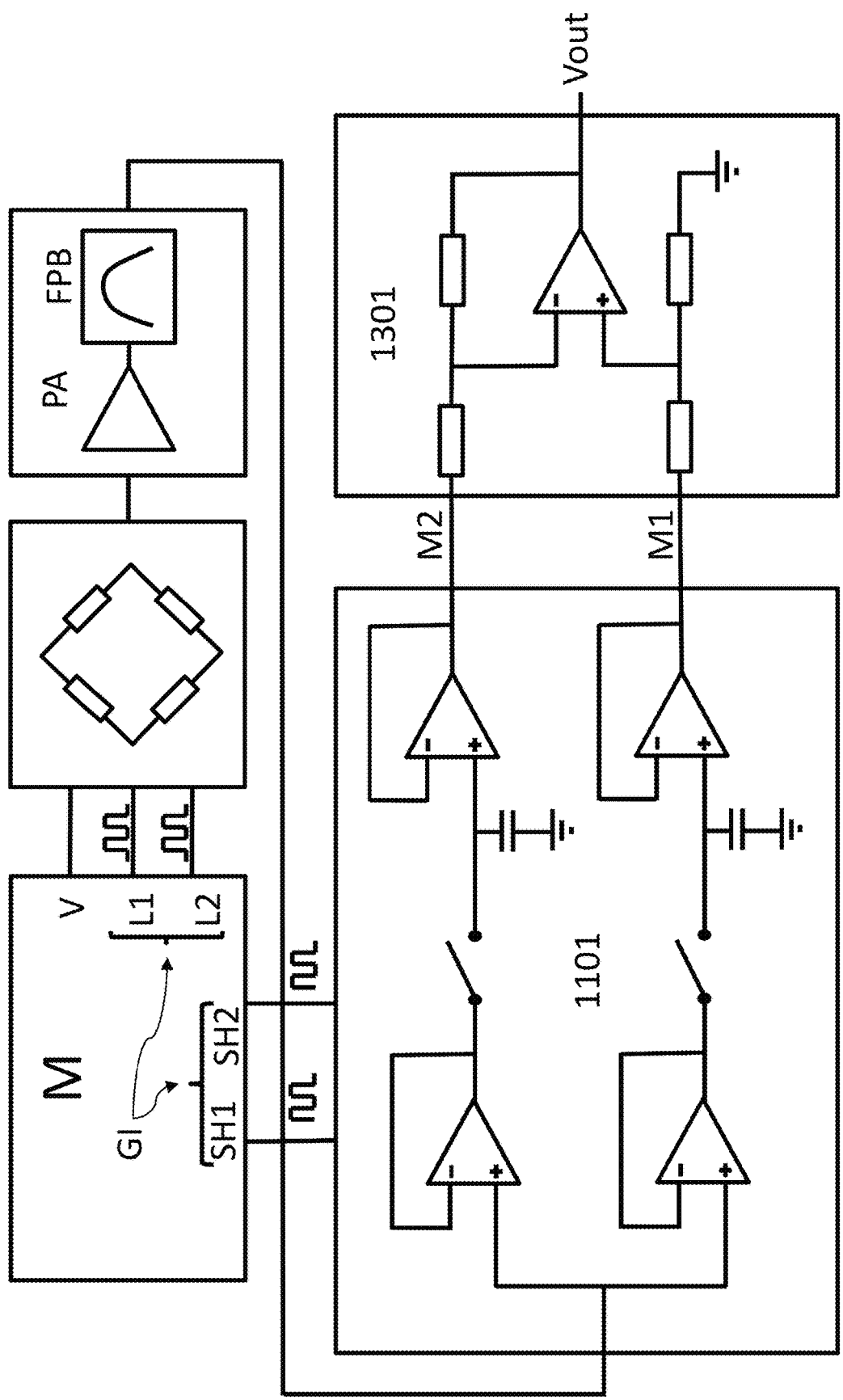
Figure 12:
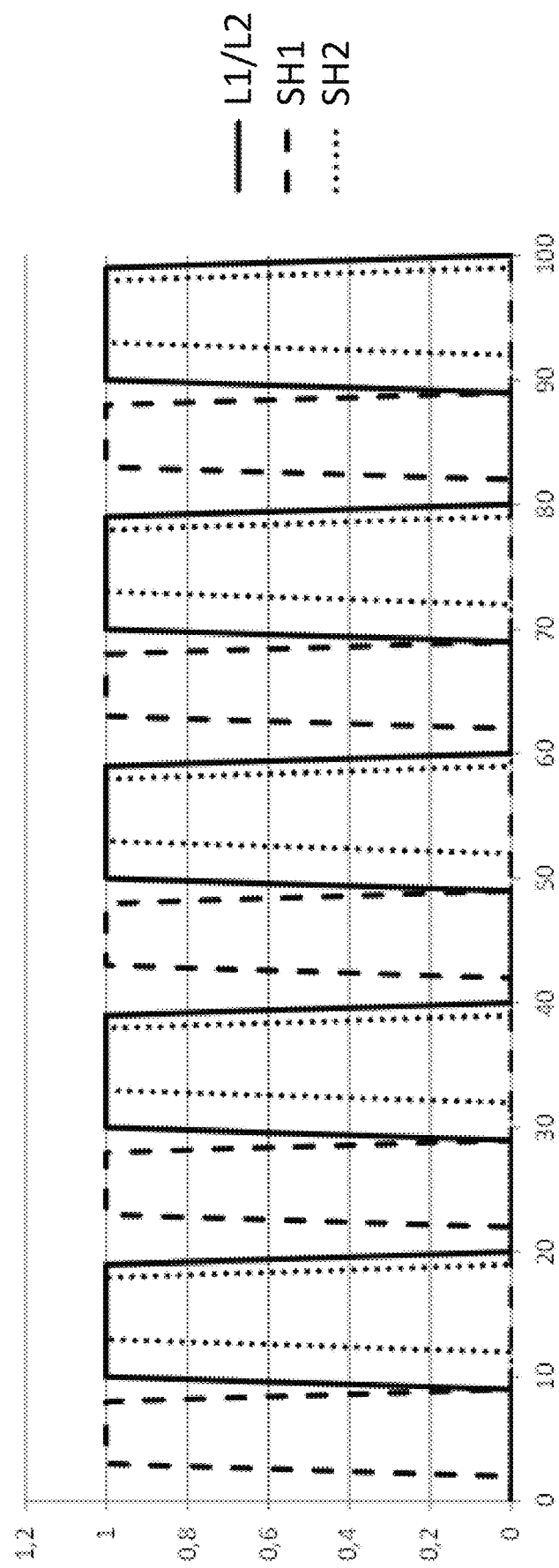

FIG. 9 schematically illustrates an embodiment of the system S for suppressing low frequency noise with digital treatment of the signal derived from the measuring device D;

FIG. 10 shows the electronic diagram of an embodiment of the system S for suppressing low frequency noise making it possible to obtain the two curves M1 and M2 in an analogue manner and to perform a digital linear combination;

FIG. 11 shows the electronic diagram of an embodiment of the system S for suppressing low frequency noise making it possible to obtain the two curves M1 and M2 in an analogue manner and to perform an analogue linear combination;

FIG. 12 shows an example of signals derived from the modulation means M and making it possible to modulate the sensitivity of GMR or TMR sensors; FIG. 12 also shows the signals used to manage the analogue processing circuits of the signals M1 and M2;

FIG. 13 shows the steps of the method for implementing the system for reducing noise according to the invention.

DETAILED DESCRIPTION OF THE INVENTION

Figure 1:
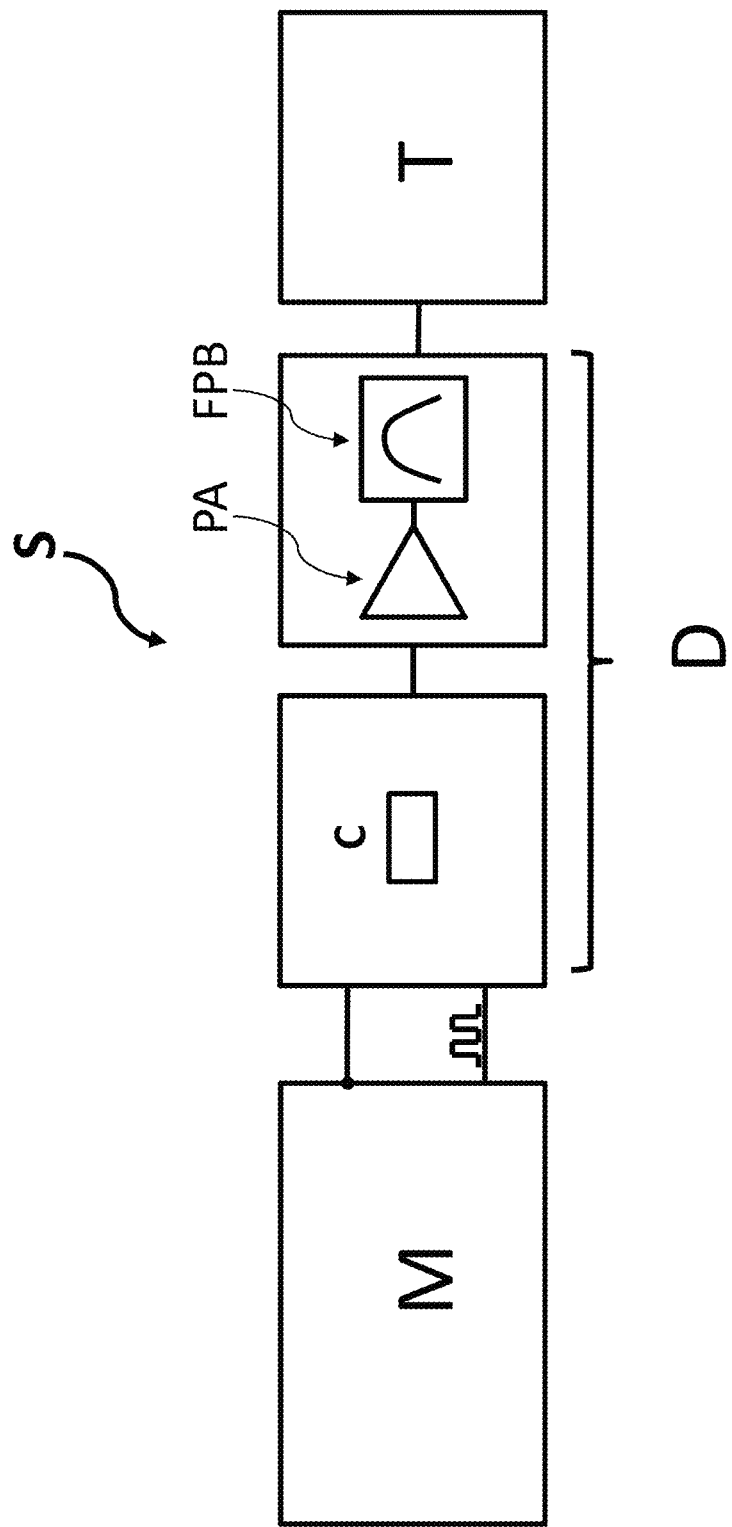
FIG. 1 shows a diagram of the system S for reducing low frequency noise according to a subject matter of the invention.

FIG. 1 shows an example of the system S for reducing low frequency noise according to the invention. The system S includes:
- modulation means M used to modulate the sensitivity of at least one magnetoresistive sensor; the modulation means include for example a generator of DC voltage V and a current or voltage pulse generator GI;
- a device D for measuring an external magnetic field B; the device D includes at least one magnetoresistive sensor C, a low noise amplifier PA for the amplification of the signal derived from the magnetoresistive sensor C and a bandpass filter FPB to eliminate the low and high frequency components of the signal measured by D; it is important to note that each magnetoresistive sensor forming part of the device D has different operating points with different sensitivities to the external magnetic field B; the device D supplies a first measurement M1 and a second measurement M2 derived from the device D;
- a device for processing the signal T to record the two measurements M1 and M2 and/or perform the linear combination of the first measurement M1 and the second measurement M2.

Figure 2:
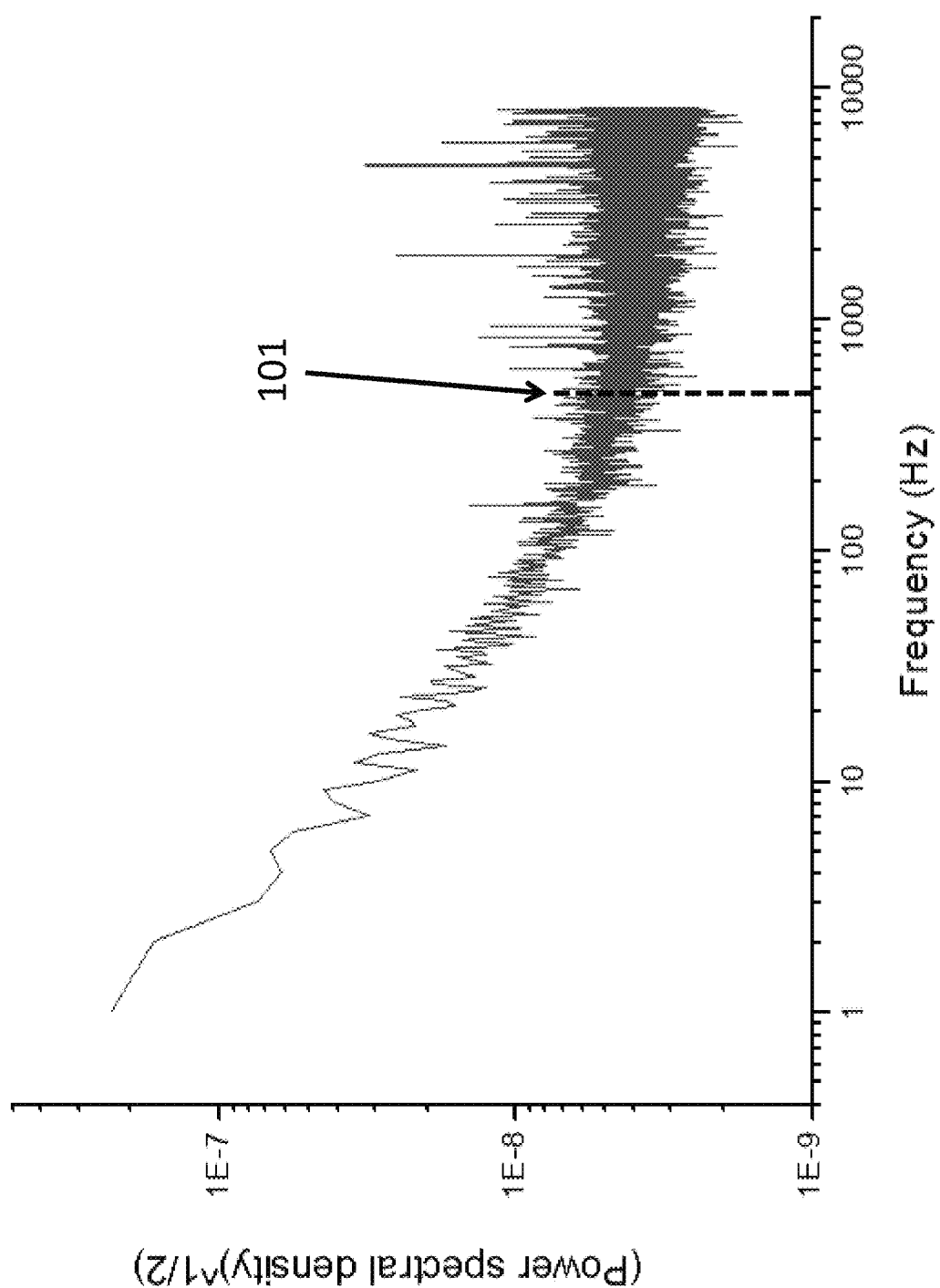
FIG. 2 shows the 1/f noise or low frequency noise spectral density.

FIG. 2 shows an example of 1/f noise spectral density of a magnetoresistive sensor. In this figure it may be seen that low frequency noise becomes less than thermal noise from the frequency 101. In this case, it is necessary that the oscillation frequency between the two operating points is greater than the frequency 101 and, if it is possible, at least two times greater than the frequency corresponding to the point 101.

The oscillation frequency between the two operating points having different sensitivities is also called frequency of modulation of the sensitivity of the magnetoresistive sensors.

Advantageously, it is better to choose a sufficiently high modulation frequency, that is to say above the frequency where the fluctuations in resistance become equal to the thermal noise.

Figure 3:
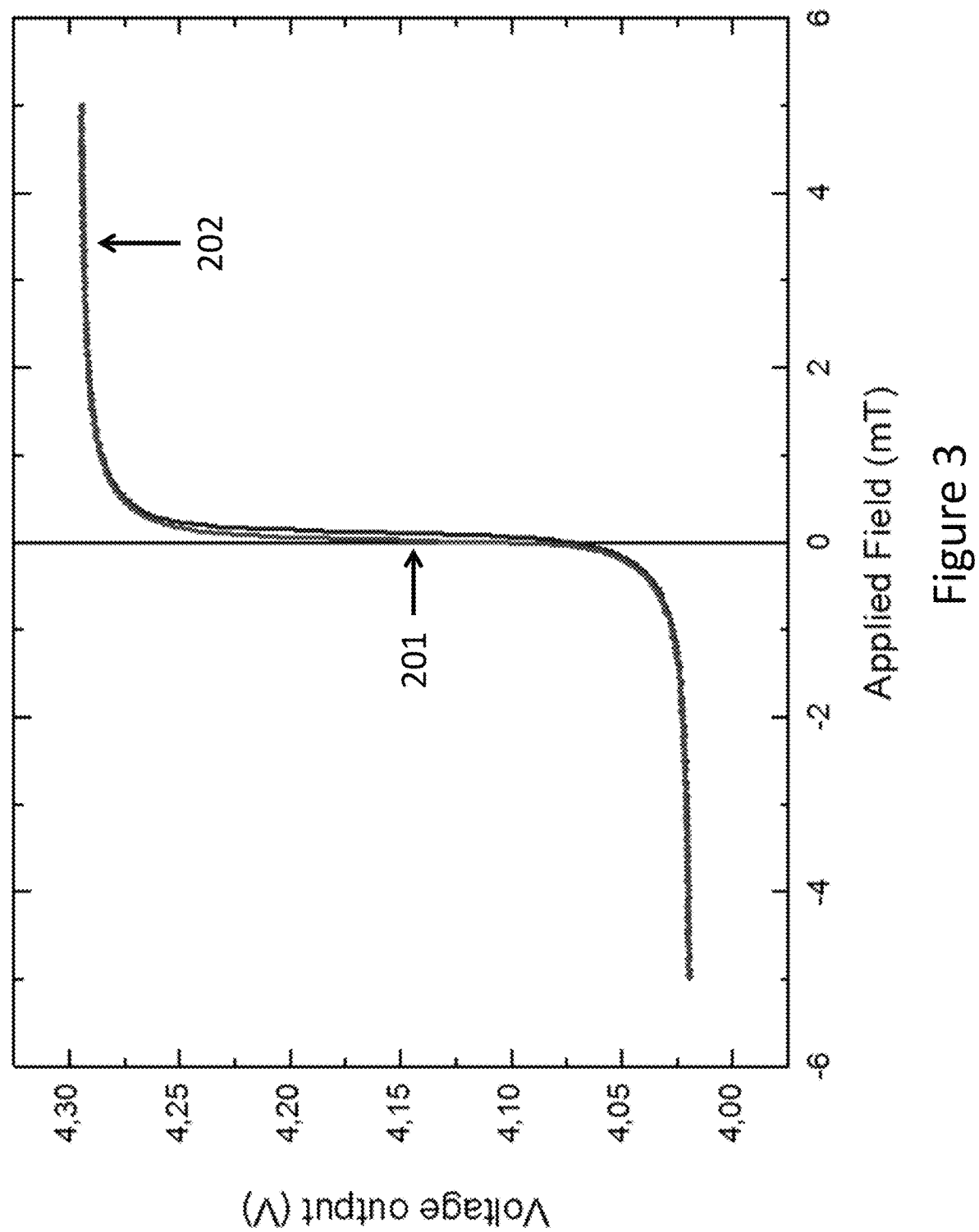
FIG. 3 shows a typical response of a GMR or TMR sensor.

FIG. 3 shows the typical response of a magnetoresistive sensor of GMR or TRM type linearized to have a correct response in zero field. The y-axis represents the voltage measured at the terminals of the magnetoresistive sensor and the x-axis represents the external magnetic field. The two operating points 201 and 202 are two points having a first sensitivity S1 and a second sensitivity S2.

The sensitivity being proportional to the slope of the curve illustrated in FIG. 3, it may be seen that the point 201 corresponds to a high sensitivity S1 and the point S2 to a low or zero sensitivity. In particular, the point 201 lies in the operating zone or sensitivity zone of the sensor. The point 202 lies in the saturation zone where its sensitivity becomes low or zero. The system S according to the invention makes it possible to make the magnetoresistive sensor oscillate between the two points 201 and 202.

For example, when a magnetic field applied to each magnetoresistive element exceeds a value Hs in the plane of the axis of sensitivity of the stack, the sensor is in the saturation region.

Figure 4:
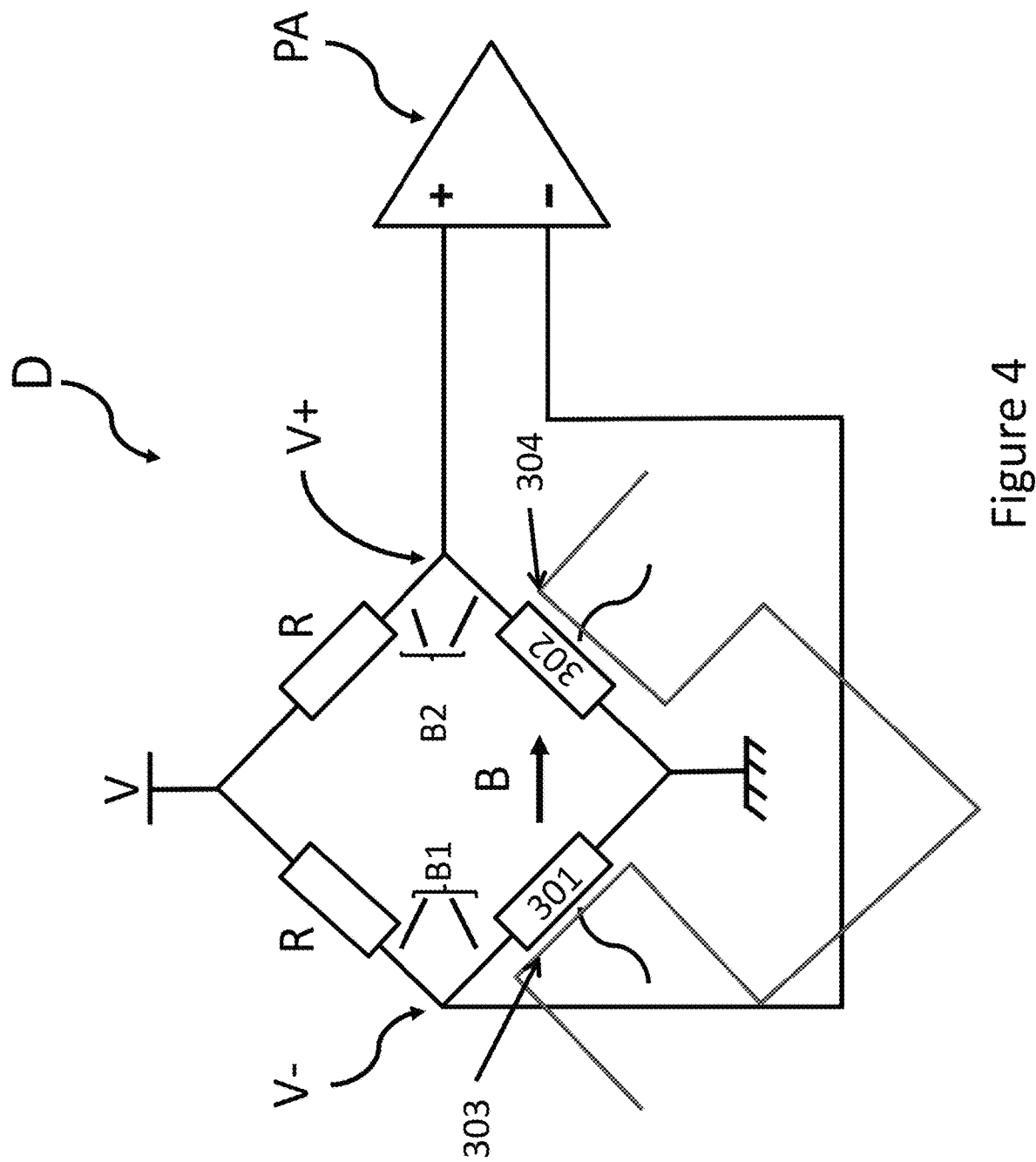
FIG. 4 shows a first example of measuring device D associated with the system S for reducing low frequency noise such as given in FIG. 1; in this case a half-bridge arrangement with two magnetoresistive elements is represented.

FIG. 4 shows a first embodiment of the measuring device D of the system S according to the invention. According to this embodiment, the measuring device D includes two magnetoresistive sensors 301 and 302 and two identical resistors R. These four elements are connected according to a half-bridge arrangement illustrated in FIG. 4.

In particular, the half-bridge arrangement includes a supply voltage V connected to a first arm B1 and to a second arm B2. The two arms are connected in parallel. The end of the arms B1 and B2 opposite to the end connected to the voltage V is connected to earth. Each of the two arms B1 and B2 includes a resistor R and a magnetoresistive element. In the example illustrated in FIG. 4, the supply voltage V is connected to the junction point between the two resistors R. Alternatively, the voltage V may be connected to the junction point between the two magnetoresistive sensors 301 and 302.

Each arm B1, B2 of the arrangement of FIG. 4 includes an output V−, V+. The two outputs V−, V+ are connected to a low noise preamplifier PA.

The two magnetoresistive sensors 301 and 302 have an inverse response to the external field. In other words, under the action of the external and uniform magnetic field in the volume occupied by the bridge of FIG. 4, an increase in magnetoresistance of the first magnetoresistive sensor 301 corresponds to a decrease in magnetoresistance of the second magnetoresistive sensor 302.

Advantageously, this makes it possible to measure a potential difference between the two outputs V+ and V−, which is proportional to the external magnetic field to measure.

To implement the invention, it is necessary to modulate the sensitivity of the magnetoresistive sensors 301 and 302 between the first operating point 201 having a high sensitivity S1 and the second operating point Ssat having zero sensitivity. This modulation may be obtained by applying a sufficiently intense magnetic field in the plane of the layers of the magnetoresistive sensors to saturate the sensors by displacing it in the saturation zone.

The two elements 301 and 302 having an inverse response, the saturation field to apply to each element must be inversed.

According to the embodiment illustrated in FIG. 4, the application of the saturation magnetic field to each element 301, 302 is carried out thanks to the current lines 303 and 304. The strong field-zero field oscillation takes place by integrated current lines 303 and 304 as proposed for example in FIG. 6. The current must be chosen in such a way that the sensor saturates in the current mode applied, that is to say that it makes it possible to create a magnetic field on elements greater than Hs+Hp where Hp is the desired field operating range for the sensor and Hs is the saturation field of the element. Since the current applied for a same field is going to vary inversely with the width of the sensors, it is preferable to use sensors having low lateral dimension typically of the order of 3 to 5 µm, but widths outside of this range may be chosen.

The first operating point of the sensor corresponds to zero current in the lines. The second operating point corresponds to current in the lines, which saturates the sensors by creating a sufficiently intense saturation magnetic field. It should be underlined that it is necessary to apply the current in the lines in such a way that the second operating point 202 corresponds to the same resistance value for the two sensors and must thus be physically inversed given their inverse response. The layout of the current lines 303, 304 illustrated in FIG. 4 makes it possible for a same current circulating in the lines to obtain inversed magnetic fields in correspondence with the elements 301 and 302 having inverse responses. There may be rapid small transients during the application of the current and its suppression.

Advantageously, the current lines 303 and 304 may be integrated in the measuring device D, reducing the bulk of the system for reducing low frequency noise S.

Alternatively, if the elements 301 and 302 are sufficiently spaced apart, two independent coils may be used for the application of the saturation magnetic field.

Advantageously, the half-bridge arrangement makes it possible to have an output independent of the operating point of the magnetoresistive sensors. In other words, the differential output voltage of the bridge of FIG. 4 when the magnetoresistive elements are at the first operating point 201 is close to the differential voltage when the magnetoresistive elements are at the saturation point 202.

This configuration is very advantageous because in both cases it is possible to amplify the output voltage of the bridge without saturating the low noise preamplifier PA.

Figure 5:
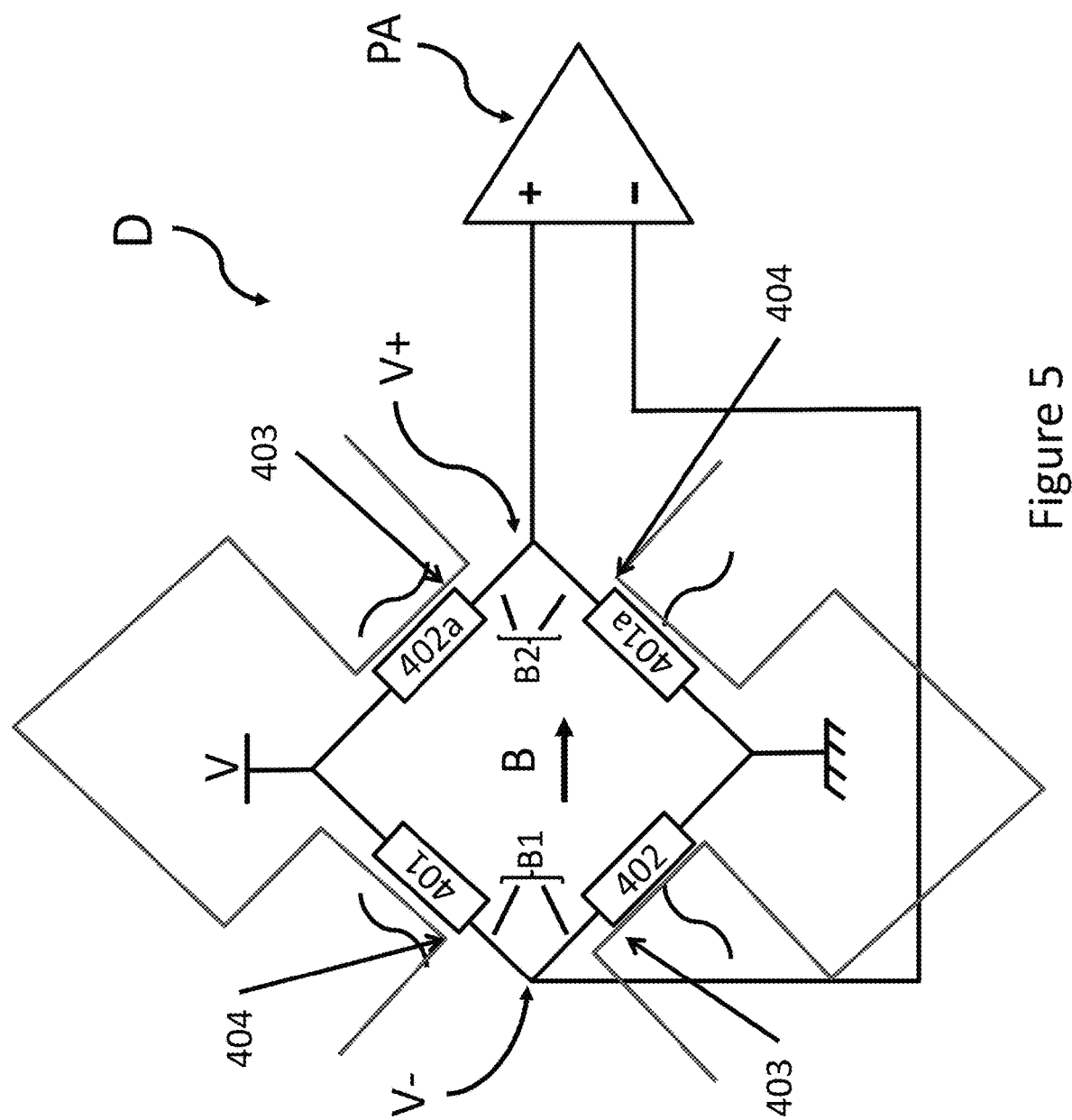
FIG. 5 shows a second example of measuring device D associated with the system S for reducing low frequency noise such as given in FIG. 1; in this case a complete bridge arrangement with four magnetoresistive elements is represented.

FIG. 5 shows a second embodiment of the measuring device D for the system S for reducing low frequency noise. In this case, there is a complete bridge arrangement with four magnetoresistive elements. The elements 401 and 401a have an inverse response compared to the elements 402 and 402a.

The operation of the circuit of FIG. 5 is similar to the operation of FIG. 4. The saturation field of the magnetoresistive elements may be applied thanks to the current lines 403 and 404. These current lines may be integrated in the device D to reduce the bulk of the system S.

Alternatively, if the elements 401, 401a, 402, 402a are sufficiently spaced apart, four independent coils may be used to generate the magnetic field to saturate the sensors.

Advantageously, the bridge arrangement makes it possible on the one hand to have an output independent of the operating point of the magnetoresistive sensors and on the other hand makes it possible to gain a factor 2 on the output amplitude.

Both in the case of the half-bridge arrangement illustrated in FIG. 4 and in the case of the bridge arrangement illustrated in FIG. 5, the magnetoresistive elements must have an inverse response. This inverse response may be obtained according to already known methods: the first consists in mounting 4 identical but physically inversed sensors. This method is simple to use but requires having two independent silicon dies and thus has a higher commercial cost. The second method consists in flipping by local heating means the reference layer of the two magnetoresistive elements 402, 402a by local under field heating. The third method consists in depositing two slightly different stacks which have inverse but very similar responses. In a preferential embodiment, the second method is applied, which makes it possible to have a method that can be industrialised at low cost.

Figure 6:
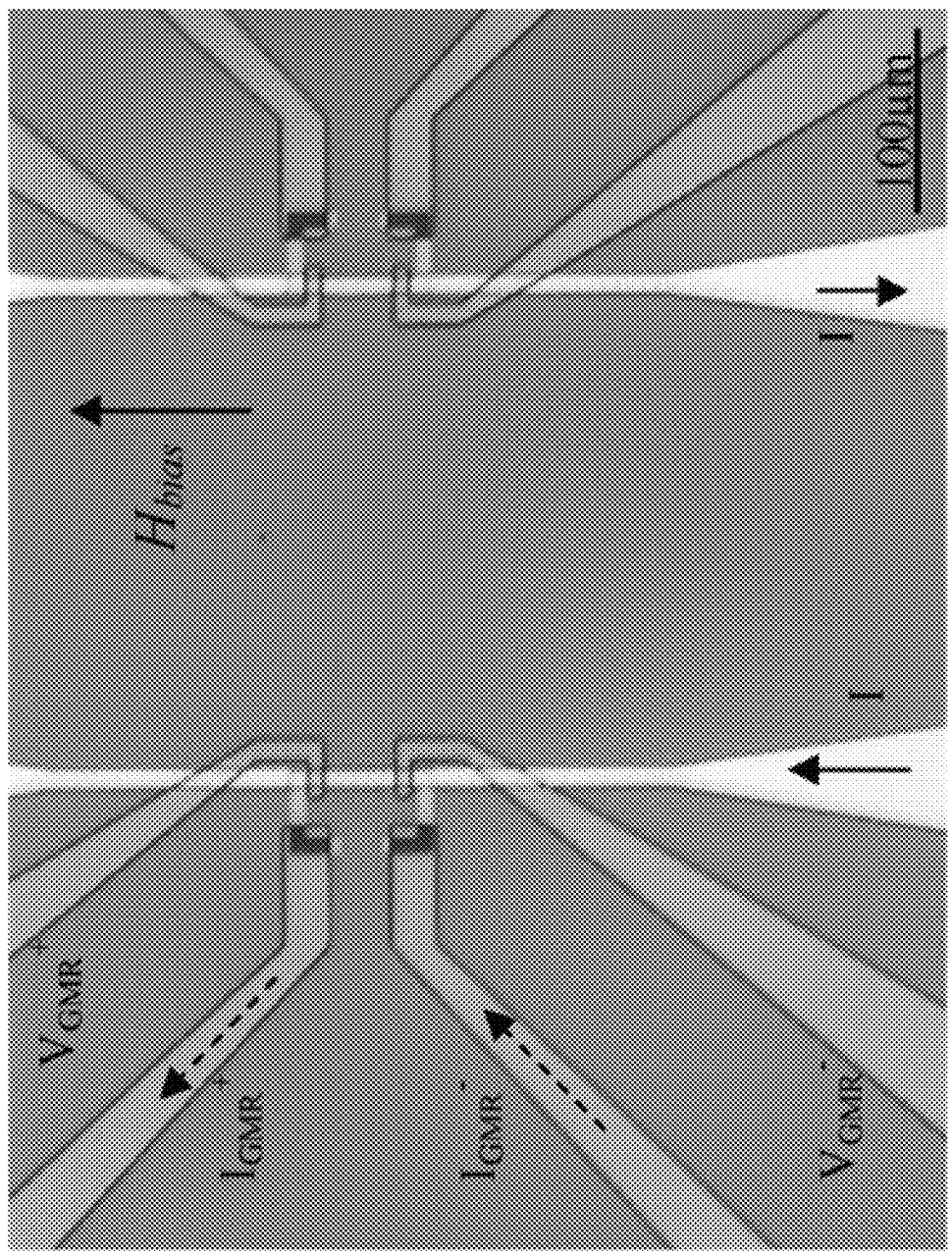
FIG. 6 shows a physical example of C-shaped GMR sensor, with integrated current lines and making it possible to apply a magnetic field for the modulation of the sensitivity of the sensor; this system may be used in the device D for measuring the magnetic field such as given in FIG. 1.

FIG. 6 shows a physical example of a C-shaped GMR sensor with integrated current lines making it possible to create a sufficient field to saturate the sensors while having low current consumption.

Figure 7:
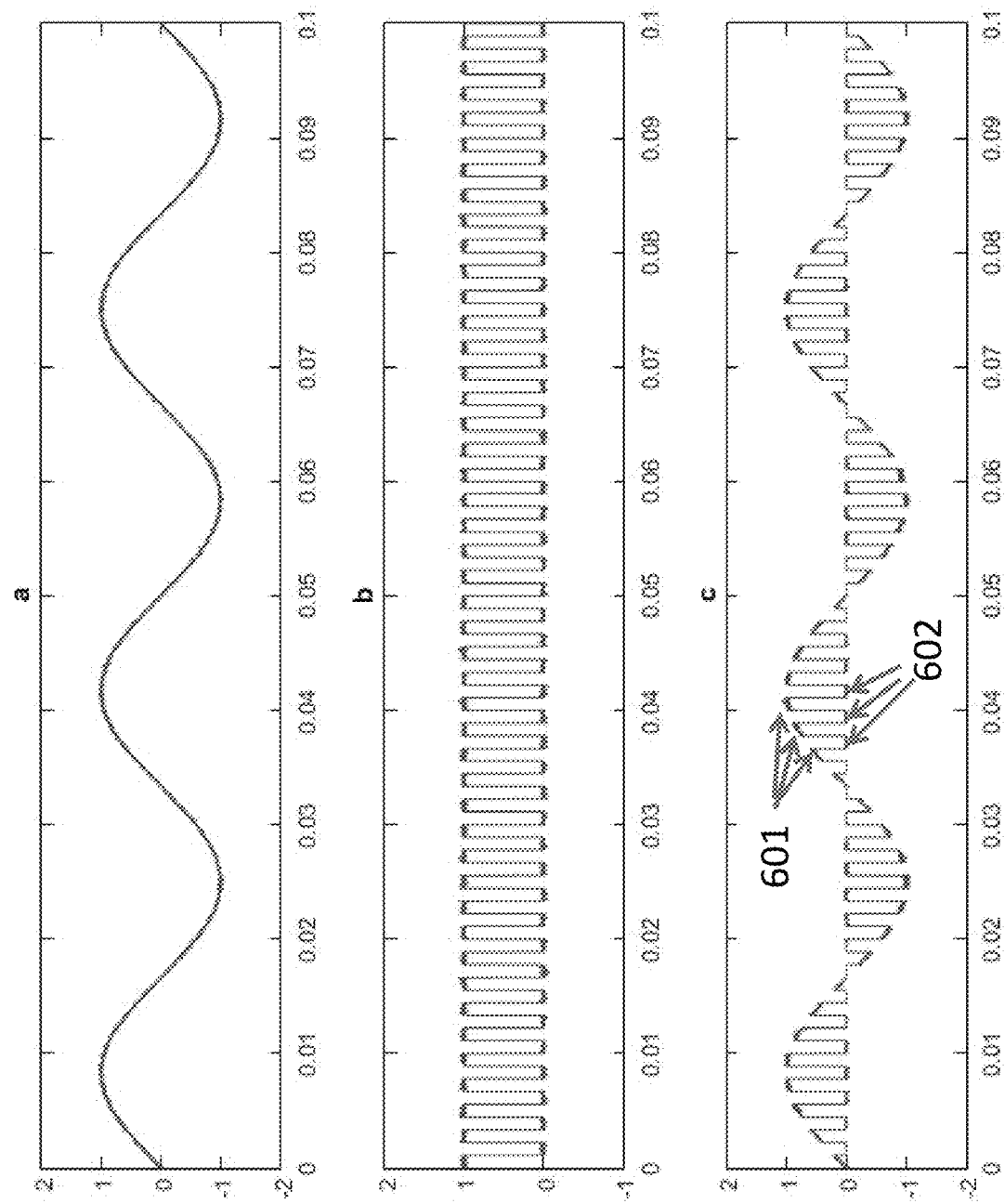
FIG. 7 shows an example of time curve of output of a bridge such as given in FIG. 5.

FIG. 7a shows an example of time curve of output of a device D such as that represented in FIG. 5. This curve represents the output voltage of the bridge of FIG. 5, the bridge being subjected to a sinusoidal external magnetic field. The curve 7b shows the current in the current lines 403 and 404. The current sent into the current lines corresponds to the magnetic field applied to the sensors 401, 401a, 402 and 402a and capable of saturating it. In other words, when the current in the lines is zero, the sensors are at the first operating point 201 with high sensitivity.

In the presence of current in the lines, the applied magnetic field saturates the sensors C by displacing their operating point to the point 202 with low or zero sensitivity.

Advantageously, the current in the current lines 403, 404 is for example controlled thanks to the modulation means M of FIG. 1. The absence of current in the lines corresponds to the first configuration of the modulation means M and the presence of current in the lines corresponds to the second configuration of the modulation means M.

Advantageously, the operating point of the magnetoresistive elements of the measuring device D may be controlled thanks to the modulation means M.

FIG. 7c gives the output of the bridge in the presence of the external magnetic field and the excitation of current of FIG. 7b. In this curve it may be seen that in the absence of current in the current lines 403, 404 the device D is sensitive to the external magnetic field and the output of the bridge follows the variations in this field. It involves, for example, measurement at the point 601 of FIG. 7b.

In the presence of current in the current lines 403, 404 the magnetoresistive sensors are saturated and the device D is no longer sensitive to the external magnetic field. It involves, for example, measurement at the point 602.

The device D of the system S according to the invention is thus capable of supplying a first measurement M1 corresponding to the first operating point of the magnetoresistive sensors. This first measurement M1 corresponds to points of type 601 in FIG. 7c. The device D is also capable of supplying a second measurement M2 corresponding to the second operating point of the magnetoresistive sensors. The second measurement M2 corresponds to the points of type 602 in FIG. 7c.

Advantageously, the second measurement M2 associated with the points of type 602 of FIG. 7c contains fluctuations in resistance mainly due to the low frequency noise of the magnetoresistive elements.

By performing a linear combination of the measurements M1 and M2 it is thus possible to eliminate low frequency noise.

FIG. 8 shows a typical stack of a tunnel magnetoresistance TMR. The layer 701, often an alloy of Cu or CuN type, serves as lower electrode. The layer 702 serves as growth layer. The layers 703, an antiferromagnetic of PtMn or IrMn type coupled to a layer of CoFeB 704 type, serve as reference. The barrier is formed of $Al_2O_3$ or preferentially MgO 705. The layers 706 and 707 form a conventional free layer. That is to say a layer that follows the external field. The layer 708 serves as protection and starting point for the upper contact of the tunnel junction.

Numerous alternatives of stack known from the literature exist.

FIG. 9 shows an exemplary embodiment of the system S according to the invention in the case of direct digital acquisition and digital reconstruction of the noise-free signal.

The modulation means M generate a supply signal V as well as two periodic signals L1 and L2 of frequency f and of adjustable pulse width. The typical frequency f for GMRs is around 100 kHz. For small sized TMRs it may go up to 10 MHz. The signal V is a DC voltage that supplies the GMR or TMR bridge. The periodic signals L1 and L2 supply the current lines 403, 404. A typical pulse width value is 50% of the total cycle. The two pulses are in phase. At the bridge output, a low noise preamplifier PA as well as a filter FPB cutting frequencies above and well below f condition the signal that is digitally acquired, converted and processed by the digital processing means DSP.

The modulation means M according to the embodiment 9 include for example a DC voltage V generator and a pulse generator or a function generator GI.

The very low noise preamplifier PA must have a bandwidth of at least 5 times the switching speed.

The digital signal processing means DSP carry out a very rapid acquisition, typically at a sampling frequency around 10 MHz. The signal is acquired directly in output of the filter FPB. In this case, all the processing is done in a digital manner. The points after each field transition applied are averaged. In this way, the two curves M1 and M2 are reconstructed. These two curves are next subtracted to obtain the noise-free signal.

Advantageously, this embodiment is easy to implement, thanks to the use of digital signal processing means DSP.

Other embodiments are based on the use of analogue signal processing means T.

FIG. 10 shows an example of electrical diagram making it possible to obtain the two independent curves M1 and M2 in an analogue manner and a linear combination performed digitally thanks to the digital processing means DSP. In addition to modules already present in FIG. 9, a double Sample & Hold 1101 is inserted. It is commanded by the modulation means M which generate at this moment 4 signals. Two signals, L1 and L2, are intended for the current lines of the bridge according to FIG. 4 and two signals of pulse width lower by around 40% and in phase opposition are sent to the Sample & Hold 1101. Thus, the two S&H 1101 separate the measured signals when the magnetoresistive sensors are not saturated, measurement M1, and when the magnetoresistive sensors are saturated, measurement M2. The two signals M1 and M2 are stored, converted and subtracted to obtain the noise-free signal. These operations of storage and subtraction of the measurements M1 and M2 are carried out by the digital signal processing means DSP.

More specifically, the operation of the two S&H circuits 1101 is explained in relation to FIG. 12 which shows the signals generated by the function generator GI.

The function generator has the role of a master clock at high frequency f typically 1 MHz and generates three signals L1/L2, SH1, SH2. The signal L1/L2 manages the implementation of the zero current-strong current switching and makes it possible to pass from the detection mode to the saturated mode. The signal SH1 manages a first S&H 1101, the signal SH2 manages the second S&H 1101.

FIG. 12 shows that a first S&H circuit is in acquisition mode during the absence of current in the current lines, namely when the L1/L2 signal is zero. This first S&H circuit makes it possible to work back to the measurement M1. Conversely, the second S&H circuit is in acquisition mode when current circulates in the current lines, namely when the signal L1/L2 is non-zero. This second S&H circuit makes it possible to work back to the measurement M2, containing essentially fluctuations in resistance due to low frequency noise.

The first configuration of the modulation means M corresponds to the absence of signal L1/L2: the magnetoresistive sensors are in the sensitivity zone. The second configuration of the modulation means M corresponds to the presence of signal L1/L2: the magnetoresistive sensors are in the saturation zone.

Advantageously, this manner of managing the S&H circuits makes it possible to separate the measurements M1 and M2 using an electronic that is simple to produce and of low cost.

The time shift between the signal L1/L2 and the two signals SH1 and SH2 is such that the S&H circuits are placed in acquisition mode after a short time at the end of switching and in memory mode before the following switching, as shown in FIG. 12.

Advantageously, this time shift makes it possible to separate the transients that follow a switching and to make the elimination of low frequency noise more precise.

FIG. 11 shows a third exemplary embodiment of the system S according to the invention, with a step of entirely analogue processing of the signal. Unlike the device of FIG. 10, this time the digital signal processing means DSP are replaced by a subtraction circuit 1301 capable of performing the subtraction of the two measurements M2 and M1 in an analogue manner.

Advantageously, the system of FIG. 11 is a totally analogue system and potentially integrable at the level of the sensor, making these steps of modulation and subtraction transparent for the user.

FIG. 13 shows the steps of the method for implementing the system S according to the invention.

During a first step ID, the two operating points 201 and 202 of the at least one magnetoresistive sensors forming part of the device for measuring D the external field B are chosen. The points 201 and 202 are chosen so as to have two very different sensitivities to the external magnetic field B. The sensitivity Ssat at the second operating point is very low or zero.

During the second step MOD, the modulation means M are used to switch the at least one magnetoresistive sensor C from the first operating point 201 having the first sensitivity S1 to the second operating point 202 having the second sensitivity Ssat and from the second operating point 202 to the first operating point 201.

During the step MES, the response of the magnetoresistive sensors of the device D in the sensitivity zone and in the saturation zone is recorded, the modulation of the sensitivity of the magnetoresistive sensors still being underway. The response of the magnetoresistive sensors in the saturation zone, or measurement M2, essentially contains fluctuations in resistance due to low frequency noise. The response of the magnetoresistive sensors in the sensitivity zone, or measurement M1, contains variations in resistance due to variations in the external magnetic field, in addition to fluctuations due to low frequency noise. Two time dependent and independent curves are thereby obtained.

It is thus possible, during the step LIN, to perform a linear combination of the measurements M1 and M2 to obtain the noise-free signal and optionally a curve giving uniquely internal fluctuations in resistance.

According to an embodiment, the linear combination of the step LIN consists in subtracting the two measurements M1 and M2.

According to another embodiment, during the step LIN the measurements M1 and M2 are linearly combined according to a formula of type M1−αM2. The parameter α essentially depends on the residual sensitivity during the measurement M2. If this is zero, α is zero, if not it will be around equal to the sensitivity ratio.

According to an embodiment of the method according to the invention, the frequency of modulation of the sensitivity of the magnetoresistive sensors is greater than the frequency 101 at which low frequency noise becomes less than the thermal noise associated with the magnetoresistive sensors.

According to an embodiment of the method, the frequency of modulation of the sensitivity of the sensor is at least two times greater than the frequency 101 at which low frequency noise becomes less than the thermal noise associated with the magnetoresistive sensors.

The step MES may be carried out using the measuring device D. The device D may be produced according to one of the configurations illustrated in relation to the system S according to the invention.

The steps MES and LIN may be carried out using means for processing the signal T. The processing means T may be digital, analogue or in part digital and in part analogue according to one of the configurations explained in relation to the system S according to the invention.

The invention claimed is:

1. System for suppressing low frequency noise of magnetoresistive sensors, said system comprising:
   a measuring device for measuring a magnetic field, said measuring device including at least one magnetoresistive sensor, said magnetoresistive sensor having a first sensitivity at a first operating point and a second sensitivity at a second operating point, the sensitivity at the second operating point being low or zero, said measuring device providing a first measurement when the magnetoresistive sensor is at the first operating point and a second measurement when the magnetoresistive sensor is at the second operating point, said first measurement corresponding to a first response of the measuring device in the presence of the magnetic field at the first operating point and said second measurement corresponding to a second response of the measuring device in the presence of the magnetic field at the second operating point;
   a modulator comprising a voltage generator and a current or voltage pulse generator and configured to switch the magnetoresistive sensor from the first operating point to the second operating point and from the second operating point to the first operating point so that said measuring device provides said first measurement and said second measurement, said modulator having a first configuration corresponding to the first operating point and a second configuration corresponding to the second operating point, and
   a signal processor configured to process the signal derived from the measuring device, said signal processor being configured to make a linear combination of the first response of the measuring device in the presence of the magnetic field at the first operating point corresponding to the first configuration of the modulator and the second response of the measuring device in the presence of the magnetic field at the second operating point corresponding to the second configuration of the modulator.

2. The system for suppressing low frequency noise of magnetoresistive sensors according to claim 1, wherein the measuring device includes current lines to apply a magnetic field in the plane of the layers of the magnetoresistive sensors, such that in the presence of current in the lines each magnetoresistive sensor is at the second operating point and in the absence of current in the lines each magnetoresistive sensor is at the first operating point.

3. The system for suppressing low frequency noise of magnetoresistive sensors according to claim 1, wherein the modulator includes a high frequency master clock for the generation of a switching signal between the first operating point and the second operating point.

4. The system for suppressing low frequency noise according to claim 1, wherein the switching signal includes current pulses circulating in the current lines for the switching of each magnetoresistive sensor between the first operating point and the second operating point.

5. The system for suppressing low frequency noise of magnetoresistive sensors according to claim 1, wherein the signal processor configured to process the signal derived from the device for measuring a magnetic field includes:
   a first Sample and Hold circuit intended to record the signal measured by the measuring device at the first operating point;
   a second Sample and Hold circuit intended to record the signal measured by the measuring device at the second operating point;
   a digital or analogue acquisition system for the linear combination of the signals derived from the first and second Sample and Hold circuits.

6. The system for suppressing low frequency noise of magnetoresistive sensors according to claim 1, wherein the measuring device for measuring a magnetic field includes two magnetoresistive sensors arranged according to a half-bridge arrangement and a low noise preamplifier, the two magnetoresistive sensors having an inverse response to the magnetic field, the half-bridge arrangement including a first arm and a second arm, the first and second arms being connected in parallel, each of the first and second arms including a resistor and one of the magnetoresistive sensors, the half-bridge arrangement further including a first and a second output, the first and second outputs being connected to the low noise preamplifier, each output being the junction point between one of the resistors and one of the magnetoresistive sensors.

7. The system for suppressing low frequency noise of magnetoresistive sensors according to claim 6, wherein the measuring device includes a DC voltage source for the supply of the half-bridge arrangement, the DC voltage being connected to the junction point between the two resistors or to the junction point between the two magnetoresistive sensors.

8. The system for suppressing low frequency noise of magnetoresistive sensors according to claim 1, wherein the measuring device includes a first and a second pair of magnetoresistive sensors and a low noise preamplifier, the magnetoresistive sensors of the first pair having an inverse response compared to the magnetoresistive sensors of the second pair, the magnetoresistive sensors being arranged according to a bridge arrangement, the bridge arrangement including a first arm and a second arm, the first and second arms being connected in parallel, each of the first and second arms including a magnetoresistive sensor of the first pair and a magnetoresistive sensor of the second pair, the bridge arrangement further including a first and a second output, the first and second outputs being connected to the low noise preamplifier, each output being the junction point between a magnetoresistive sensor of the first pair and a magnetoresistive sensor of the second pair.

9. The system for suppressing low frequency noise of magnetoresistive sensors according to claim 8, wherein the measuring device includes a DC voltage source for the supply of the bridge arrangement, the DC voltage source being connected to a junction point between a magnetoresistive sensor of the first pair and a magnetoresistive sensor of the second pair.

10. Method for suppressing low frequency noise associated with the measurement of a magnetic field by a measuring device including at least one magnetoresistive sensor, said method comprising:

identifying a first and a second operating point of the magnetoresistive sensor, the magnetoresistive sensor having a first sensitivity at the first operating point and a second sensitivity at the second operating point, the sensitivity at the second operating point being low or zero, said measuring device providing a first measurement when the magnetoresistive sensor is at the first operating point and a second measurement when the magnetoresistive sensor is at the second operating point, said first measurement corresponding to a first response of the measuring device in the presence of the magnetic field at the first operating point and said second measurement corresponding to a second response of the measuring device in the presence of the magnetic field at the second operating point;

modulating the sensitivity of the magnetoresistive sensor by switching the magnetoresistive sensor from the first operating point having the first sensitivity to the second operating point having the second sensitivity and from the second operating point to the first operating point, the modulating being carried out with a modulator that comprises a voltage generator and a current or voltage pulse generator and configured to switch said magnetoresistive sensor;

during the modulation, making said first and second measurements so as to measure the first response of the measuring device in the presence of the magnetic field at the first operating point and a second response of the measuring device in the presence of the magnetic field at the second operating point, and calculating a linear combination of the first response and the second response of the measuring device.

\* \* \* \* \*